(12) United States Patent
Kim et al.

(10) Patent No.: US 11,596,087 B2
(45) Date of Patent: Feb. 28, 2023

(54) DATA CENTER

(71) Applicant: SK hynix Inc., Gyeonggi-do (KR)

(72) Inventors: Myoung-Seo Kim, Gyeonggi-do (KR); Seung-Yong Lee, Gyeonggi-do (KR); Young-Pyo Joo, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 713 days.

(21) Appl. No.: 16/599,279

(22) Filed: Oct. 11, 2019

(65) Prior Publication Data

US 2020/0170146 A1    May 28, 2020

(30) Foreign Application Priority Data

Nov. 22, 2018 (KR) .................. 10-2018-0145220

(51) Int. Cl.
*H05K 7/20* (2006.01)

(52) U.S. Cl.
CPC ..... *H05K 7/20827* (2013.01); *H05K 7/20372* (2013.01); *H05K 7/20836* (2013.01)

(58) Field of Classification Search
CPC ................................................. H05K 7/20372
See application file for complete search history.

(56) References Cited

U.S. PATENT DOCUMENTS

| | | | | |
|---|---|---|---|---|
| 4,449,764 A | * | 5/1984 | Hastings | .............. E05G 7/00 |
| | | | | 261/106 |
| 4,589,712 A | * | 5/1986 | Hastings | ............. G07F 19/205 |
| | | | | 312/312 |
| 4,712,388 A | * | 12/1987 | Sullivan | ................. F17C 3/085 |
| | | | | 62/51.1 |
| 6,987,253 B2 | * | 1/2006 | Bedingham | .......... B01L 3/5025 |
| | | | | 422/50 |
| 8,869,425 B2 | * | 10/2014 | Perry | ....................... C10B 7/14 |
| | | | | 110/212 |
| 9,182,129 B2 | * | 11/2015 | Dahle | ................ A47J 37/0727 |
| 9,737,740 B2 | * | 8/2017 | Beresford | ............... A62C 3/14 |
| 10,813,254 B2 | * | 10/2020 | Marazzo | .................. F03D 9/28 |
| 10,853,460 B2 | * | 12/2020 | Crawford | .............. H05K 7/183 |
| 11,030,285 B2 | * | 6/2021 | Crawford | ............ H05K 7/1498 |

(Continued)

FOREIGN PATENT DOCUMENTS

| | | |
|---|---|---|
| CN | 1777855 A | 5/2006 |
| CN | 106091758 A | 11/2016 |
| CN | 108444019 A | 8/2018 |

(Continued)

OTHER PUBLICATIONS

Office Action issued by the Chinese Patent Office dated Jan. 6, 2022.

(Continued)

*Primary Examiner* — Robert J Hoffberg
(74) *Attorney, Agent, or Firm* — IP & T Group LLP (57) ABSTRACT

A data center includes a refrigerant induction pipe surrounding one or more regions of the data center, a refrigerant supply device suitable for supplying a refrigerant to the refrigerant induction pipe, the refrigerant having a vaporization temperature corresponding to a pseudo cryogenic temperature, a plurality of racks disposed in the one or more regions, and a plurality of rotating devices, each rotating device being suitable for rotating a corresponding one of the plurality of racks.

17 Claims, 3 Drawing Sheets

(56) References Cited

U.S. PATENT DOCUMENTS

| | | | |
|---|---|---|---|
| 11,333,419 B2* | 5/2022 | Kim | F25D 25/024 |
| 2019/0174651 A1* | 6/2019 | Crawford | H05K 7/20836 |

FOREIGN PATENT DOCUMENTS

| | | |
|---|---|---|
| CN | 207757947 U | 8/2018 |
| CN | 108721821 A | 11/2018 |
| CN | 108832501 A | 11/2018 |
| KR | 10-0582837 | 5/2006 |

OTHER PUBLICATIONS

Office Action issued by the Chinese Patent Office dated Jun. 3, 2021.

* cited by examiner

DATA CENTER

CROSS-REFERENCE TO RELATED APPLICATION

This application claims priority under 35 U.S.C. § 119 to Korean Patent Application No. 10-2018-0145220, filed on Nov. 22, 2018, the disclosure of which is incorporated herein by reference in its entirety.

BACKGROUND

1. Field

Various embodiments of the present invention relate generally to semiconductor design technology and, more particularly, to a data center including a cooling system.

2. Description of the Related Art

A data center may include a great number of computer equipment including, for example, one or more servers. Typically, each piece of computer equipment is mounted on a rack for protecting it from external shocks and for facilitating its management. The computer equipment generate heat according to their usage which needs to be managed properly to avoid operational interruptions or failures. Accordingly, a data center typically employs a cooling system for suppressing the heat generation of the computer equipment. Temperature management of data centers generally consumes significant amounts of energy and may be generally expensive. Therefore, any improvements in this area are highly desirable for improving the reliability and energy efficiency of data centers.

SUMMARY

Various embodiments of the present invention are generally directed to a data center having an improved temperature control system for maintaining an internal temperature of a rack of the data center constant.

In accordance with an embodiment of the present invention, a data center is provided which includes: a refrigerant induction pipe surrounding one or more regions of the data center; a refrigerant supply device suitable for supplying a refrigerant to the refrigerant induction pipe, the refrigerant having a vaporization temperature corresponding to a pseudo cryogenic temperature; a plurality of racks disposed in the one or more regions; and a plurality of rotating devices, each rotating device being suitable for rotating a corresponding one of the plurality of racks.

In accordance with an embodiment of the present invention a data center is provided which includes: a refrigerant induction pipe surrounding one or more regions of the data center; a refrigerant supply device suitable for supplying a refrigerant to the refrigerant induction pipe, the refrigerant having a vaporization temperature corresponding to a pseudo cryogenic temperature; a plurality of racks disposed in the one or more regions; a plurality of rotating devices suitable for rotating the plurality of racks, respectively; a plurality of temperature sensing devices suitable for sensing respective internal temperatures of the racks; and a control device suitable for controlling each of the plurality of the rotating devices based on plural pieces of temperature information generated from the temperature sensing devices.

In accordance with an embodiment of the present invention a data center is provided which includes: a refrigerant induction pipe surrounding one or more regions of the data center; a refrigerant supply device suitable for supplying a refrigerant to the refrigerant induction pipe, the refrigerant having a vaporization temperature corresponding to a pseudo cryogenic temperature; a plurality of racks disposed in the one or more regions; a plurality of rotating devices suitable for rotating the plurality of racks, respectively; and a control device suitable for controlling each of the plurality of the rotating devices individually, collectively or by group based on one or more pieces of profile information corresponding to usages of the racks for each time slot, wherein the control device controls the rotating devices to rotate at a first rotation speed in a first time slot in which the usages are higher than a threshold usage, and controls the rotating devices to rotate at a second rotation speed slower than the first rotation speed or to stop in a second time slot in which the usages are lower than the threshold usage.

In accordance with an embodiment of the present invention a data center is provided which includes: at least one region including a plurality of racks, each rack supporting one or more semiconductor devices; a plurality of rotating devices, each rotating device operably coupled to a respective rack for rotating the respective rack; a refrigerant induction pipe configured to supply a cryogenic refrigerant to the region for controlling an ambient temperature of the region within a cryogenic temperature; a control device suitable for controlling the speed of rotation of each of the rotating devices based on one or more pieces of information corresponding to the respective racks for controlling the internal temperature of each rack within a suitable cryogenic temperature range.

Each of the rotating devices may include: a supporting plate suitable for supporting a corresponding rack; and a motor suitable for rotating the supporting plate.

Each of the racks may have a cylindrical appearance.

The refrigerant may include liquid nitrogen.

These and other features and advantages of the present invention will become apparent from the following detailed description of preferred embodiments in conjunction with the accompanying figures.

DETAILED DESCRIPTION

Various embodiments of the present invention are described below in more detail with reference to the accompanying drawings. These embodiments are provided so that this disclosure is thorough and complete, and fully conveys the scope of the present invention to those skilled in the art.

The present invention will be described in greater detail with reference to the accompanying drawings. The drawings are simplified schematic illustrations of the various components of a data center according to an embodiment of the invention. As such, variations from the configurations and shapes of the Figures as a result, for example, of manufacturing techniques and/or tolerances, are to be expected. Thus, the data center should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

It will be further understood that when an element is referred to as being "connected to", or "coupled to" another element, it may be directly on, connected to, or coupled to the other element, or one or more intervening elements may be present. Furthermore, the connection/coupling may not be limited to a physical connection but may also include a non-physical connection, e.g., a wireless connection.

Figure 1:
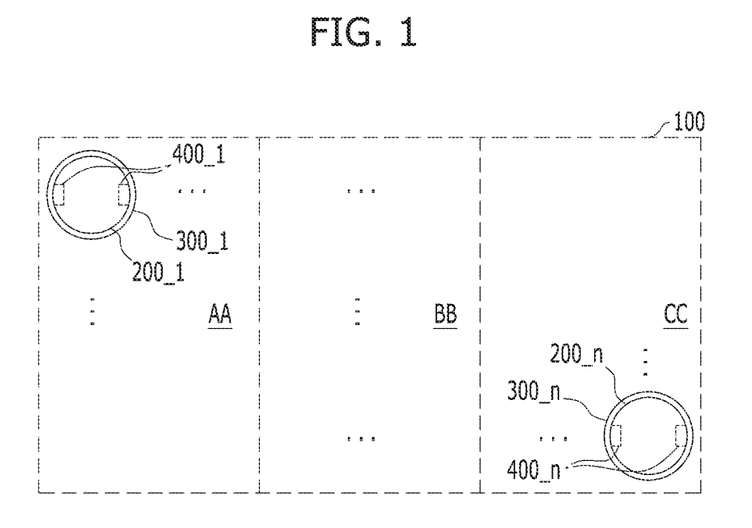
FIG. 1 is a diagram schematically illustrating a data center in accordance with an embodiment of the present invention.

In addition, it will also be understood that when an element is referred to as being "between" two elements, it may be the only element between the two elements, or one or more intervening elements may also be present. FIG. 1 is a diagram schematically illustrating a data center in accordance with an embodiment of the present invention. FIG. 1 is a plane view illustrating a portion of a data center having a plurality of regions AA, BB and CC.

Referring to FIG. 1, the data center may include a refrigerant induction pipe 100, a plurality of racks 200_1 to 200_n, a plurality of rotating devices 300_1 to 300_n and a plurality of temperature sensing devices 400_1 to 400_n.

The refrigerant induction pipe 100 may surround each of a plurality of regions AA, BB and CC. It is noted that although three regions AA, BB and CC are illustrated in FIG. 1, the invention is not limited in this way and generally, the data center may have at least one region. The refrigerant induction pipe 100 may be deployed in any suitable form. For example, the refrigerant induction pipe 100 may be designed in the form of a spider web or a mesh. The refrigerant induction pipe 100 may maintain an ambient temperature of each of the regions AA, BB, and CC in a pseudo cryogenic status by inducing a refrigerant such as liquid nitrogen LN2. By cryogenic status as this term is used herein means keeping the regions at a cryogenic temperature, i.e., at a temperature less than 123.15 K which is suitable for the operation of a CMOS device. For example, according to an embodiment a suitable cryogenic temperature may be a temperature of 77K±7K, and may be obtained using liquid nitrogen LN2 as the refrigerant. For example, a suitable refrigerant may be liquid nitrogen LN2 which has a vaporization temperature of 77 K. However, the invention is not limited to the use of liquid nitrogen as the refrigerant. Using refrigerants having lower vaporization temperatures than nitrogen may also be used. Although not illustrated, according to an embodiment, the refrigerant induction pipe 100 may include one or more induction pipes extending in a horizontal direction or a guide pipe in the form of a spider web or a mesh when viewed from the side.

The racks 200_1 to 200_n may be distributed in the regions AA, BB and CC. A first number of the racks 200_1 to 200_n may be disposed in the first region AA, a second number of the racks 200_1 to 200_n may be disposed in the second region BB, and a third number of the racks 200_1 to 200_n may be disposed in the third region CC. Preferably, the first, second and third number of racks in each of the regions AA, BB, and CC may be the same. The racks 200_1 to 200_n may be disposed uniformly in the first, second and third regions AA, BB, and CC of the data center. The racks 200_1 to 200_n may be designed in the same manner to be identical in shape, size, and material of construction. An example of a suitable rack design is described in detail below.

Each of the rotating devices 300_1 to 300_n may rotate a corresponding one of the racks 200_1 to 200_n. For example, each of the rotating devices 300_1 to 300_n may be disposed at a bottom portion of a respective one of the racks 200_1 to 200_n, and may rotate the respective rack of the racks 200_1 to 200_n clockwise or counterclockwise around a respective axis of rotation. The axis of rotation of each of the rotating devices may be a straight line extending in the direction of the height of the respective rack. The axis of rotation may pass through a center point of the rotating device and its respective rack. The rotating devices 300_1 to 300_n may be designed in the same manner to be identical, as described in detail below.

Figure 2:
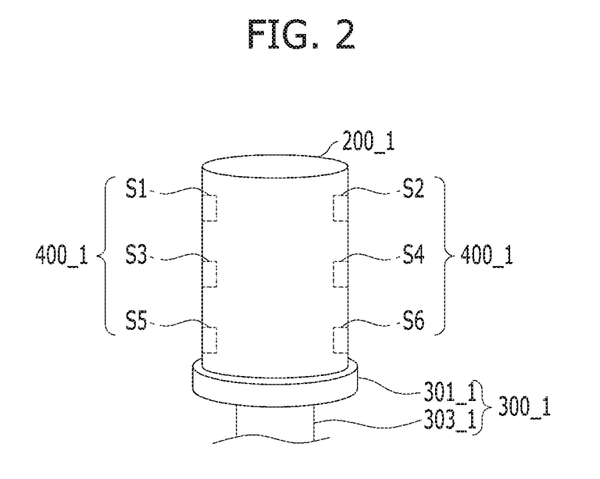
FIG. 2 is a diagram for describing in detail a first rack, a first rotating device and a first temperature sensing device which are shown in FIG. 1.

The temperature sensing devices 400_1 to 400_n may sense internal temperatures of their respective racks 200_1 to 200_n. Each of the temperature sensing devices 400_1 to 400_n may be installed in a respective rack of the racks 200_1 to 200_n for measuring the temperature of the respective rack. Each of the temperature sensing devices 400_1 to 400_n may include at least one temperature sensor. In the illustrated embodiment, each of the temperature sensing devices 400_1 to 400_n may include a plurality of sensors. For example, the temperature sensing device 400_1 is shown in FIG. 2 including six temperature sensors S1 to S6. The temperature sensing devices 400_1 to 400_n may be designed in the same manner, which will be described in detail below.

FIG. 2 representatively illustrates the first rack 200_1 among the racks 200_1 to 200_n shown in FIG. 1, the first rotating device 300_1 among the rotating devices 300_1 to 300_n and the first temperature sensing device 400_1 among the temperature sensing devices 400_1 to 400_n.

Referring to FIG. 2, a computer equipment (not illustrated) such as a server may be mounted on and stored in the first rack 200_1 which may refer to a storage box for safely and easily managing the computer equipment. The computer equipment may generate heat depending on the usage thereof. The computer equipment may include a memory module such as a DRAM. The DRAM may typically include a CMOS device, and the DRAM may operate stably at the pseudo cryogenic temperature, for example, at a cryogenic temperature of 77K±7K. Furthermore, since the DRAM hardly requires a refresh operation in the pseudo cryogenic status, operating the DRAM in the cryogenic status is more advantageous in terms of power consumption than when operating the DRAM at room temperature.

The first rack 200_1 may have a cylindrical outer appearance. This is in order to reflect the pseudo cryogenic status by the refrigerant induction pipe 100 as evenly as possible into the first rack 200_1 when the first rack 200_1 rotates around the axis of rotation. In the present embodiment, although it is described as an example that the first rack 200_1 has the cylindrical outer appearance, the present invention is not limited to this, and the first rack 200_1 may have a polygonal columnar appearance.

The first rotating device 300_1 may include a first supporting plate 301_1 and a first motor 303_1.

The first supporting plate 301_1 may support the first rack 200_1. The first supporting plate 301_1 may be a circular plate, and have an area larger than an area of the bottom surface of the first rack 200_1. In the present embodiment, although the first supporting plate 301_1 is a circular plate and has the area larger than the area of the bottom surface of the first rack 200_1, the present embodiment is not limited thereto, and the first supporting plate 301_1 may be a polygonal plate, and have an area equal to or smaller than the area of the bottom surface of the first rack 200_1.

The first supporting plate 301_1 may be securely attached to the first rack 200_1 so that the first rack 200_1 rotates with the first supporting plate 301_1. For example, although not illustrated, a fixing element for fixing the first rack 200_1 on the first supporting plate 301_1 may be employed. The fixing element may perform a function of holding the first rack 200_1 so that the first rack 200_1 is not moved but fixed when the first supporting plate 301_1 rotates. Any suitable fixing element may be employed. For example, in an embodiment, the first supporting plate 301_1 may include a rim which surrounds a bottom edge of the first rack 200_1 and includes a fixing element which includes at least three screws that can be tightened through respective holes of the rim against a side surface of the bottom edge of the first rack 200_1. The first motor 303_1 may rotate the first supporting plate 301_1. The first motor 303_1 may operate under the control of a control device 700, which will be described below. For example, the first motor 303_1 may rotate the first supporting plate 301_1 at a first rotation speed under the control of the control device 700 or rotate the first supporting plate 301_1 at a second rotation speed slower than the first rotation speed or stop the first supporting plate 301_1. The first motor 303_1 may be an electrical motor which converts electric power supplied to it to a rotating movement of a rotor shaft which is directly and fixedly coupled to the first supporting plate 301_1 to thus rotate the first rotating plate 301_1. Any suitable electrical motor may be used.

The first temperature sensing device 400_1 may include first to sixth temperature sensors S1 to S6. The first to sixth temperature sensors S1 to S6 may be disposed to face each other in pairs in the first rack 200_1. For example, the first and second temperature sensors S1 and S2 may be disposed to face each other at the upper portion of the inner surface of the first rack 200_1, the third and fourth temperature sensors S3 and S4 may be disposed to face each other at the middle portion of the inner surface of the first rack 200_1, and the fifth and sixth temperature sensors S5 and S6 may be disposed to face each other at the lower portion of the inner surface of the first rack 200_1. The first, third and fifth temperature sensors S1, S3 and S5 may be disposed on the same line in the height direction of the first rack 200_1, and the second, fourth and sixth temperature sensors S2, S4 and S6 may be disposed on the same line in the height direction of the first rack 200_1. In the present embodiment, although it is described as an example that the first temperature sensing device 400_1 includes the first to sixth temperature sensors S1 to S6, and some temperature sensors S1, S3 and S5/S2, S4 and S6 are disposed on the same line, the present embodiment may not be limited thereto. Various numbers of temperature sensors may be disposed depending on the size of the rack, and some temperature sensors S1, S3 and S5/S2, S4 and S6 may be disposed at positions deviating by a predetermined angle, for example, approximately 90 degrees.

Figure 3:
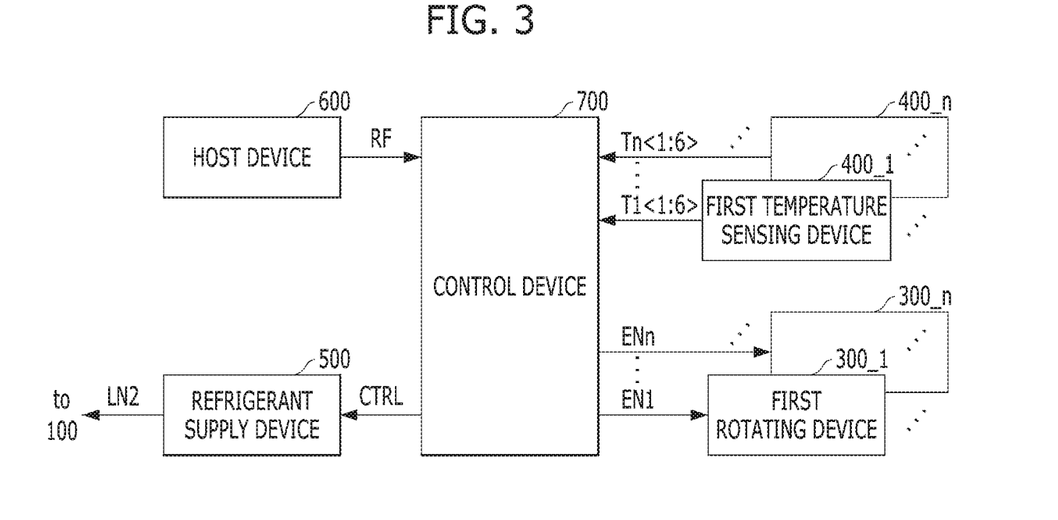
FIG. 3 is a block diagram illustrating the data center shown in FIG. 1.

FIG. 3 is a block diagram illustrating the data center shown in FIG. 1. It should be noted that the refrigerant induction pipe 100 and racks 200_1 to 200_n shown in FIG. 1 are not illustrated in FIG. 3.

Referring to FIG. 3, the data center may include a plurality of temperature sensing devices 400_1 to 400_n, a plurality of rotating devices 300_1 to 300_n, a refrigerant supply device 500, a host device 600 and a control device 700. The temperature sensing devices 400_1 to 400_n and the rotating devices 300_1 to 300_n may be substantially the same as those shown in FIGS. 1 and 2.

The temperature sensing devices 400_1 to 400_n may generate plural pieces of temperature information T1<1:6> to Tn<1:6> corresponding to internal temperatures of the racks 200_1 to 200_n. For example, a first temperature sensor S1 included in the first temperature sensing device 400_1 may generate the first temperature information T1<1> corresponding to the internal temperature of one side of the upper portion of the first rack 200_1, a second temperature sensor S2 may generate the second temperature information T1<2> corresponding to the internal temperature of the other side of the upper portion of the first rack 200_1, a third temperature sensor S3 may generate the third temperature information T1<3> corresponding to the internal temperature of one side of the middle portion of the first rack 200_1, a fourth temperature sensor S4 may generate the fourth temperature information T1<4> corresponding to the internal temperature of the other side of the middle portion of the first rack 200_1, a fifth temperature sensor S5 may generate the fifth temperature information T1<5> corresponding to the internal temperature of one side of the lower portion of the first rack 200_1, and a sixth temperature sensor S6 may generate the sixth temperature information T1<6> corresponding to the internal temperature of the other side of the lower portion of the first rack 200_1.

The refrigerant supply device 500 may supply a refrigerant, e.g. liquid nitrogen LN2 to the refrigerant induction pipe 100. Although not illustrated, the refrigerant supply device 500 may include a liquefaction plant for generating the refrigerant, a storage tank for storing the refrigerant and so on. The refrigerant may include liquid nitrogen LN2, however, the invention is not limited in this way and it should be understood that other suitable refrigerants may be used.

Since the vaporization or evaporation temperature of the liquid nitrogen is approximately 77K, the ambient temperature of the refrigerant induction pipe 100 may be maintained at approximately 77K. Liquid nitrogen LN2 may be preferred because it is less expensive than other refrigerants such as, for example, liquid helium, and also provides an effective cryogenic temperature. The operation of the refrigerant supply device 500 may be controlled based on a control signal CTRL generated from the control device 700.

The host device 600 may generate one or more pieces of profile information RF corresponding to usages of the racks 200_1 to 200_n for each time slot. For example, the host device 600 may generate first to $n^{th}$ profile information RF corresponding to the respective usages of the racks 200_1 to 200_n for each time slot. Alternatively, the host device 600 may group the racks 200_1 to 200_n in n/m number of groups, each group having 'm' number of racks, and generate first to $n/m^{th}$ pieces of profile information RF corresponding to the usages of the respective groups for each time slot. The host device 600 may generate one profile information RF corresponding to the entire usage of the racks 200_1 to 200_n for each time slot. The usage may refer to an actual usage of the computer equipment included in each of the racks 200_1 to 200_n, and be checked in real time by the host device 600.

The control device 700 may be suitable for controlling the speed of rotation of each of the rotating devices 300_1 to 300_n based on one or more pieces of information corresponding to the respective racks 200_1 to 200n for controlling the internal temperature of each rack within a suitable cryogenic temperature range.

The control device 700 may control the rotating devices 300_1 to 300_n based on the profile information RF and the temperature information T1<1:6> to Tn<1:6>. For example, the control device 700 may activate a plurality of rotating control signals EN1 to ENn for controlling each of the plurality of the rotating devices 300_1 to 300_n, individually, collectively (meaning the totality of the racks 200_1 to 200_n), or by group (2 or more racks per group based on the aforementioned grouping of the racks by the host device 600), based on the profile information RF. In addition, the control device 700 may individually activate the rotating control signals EN1 to ENn for controlling each of the plurality of the rotating devices 300_1 to 300_n based on the temperature information T1<1:6> to Tn<1:6>.

The rotating devices 300_1 to 300_n may be controlled based on the rotating control signals EN1 to ENn, respectively. The rotating devices 300_1 to 300_n may be controlled individually, collectively or by group, depending on whether the rotating control signals EN1 to ENn are activated.

Hereinafter, an operation of the data center having the aforementioned structure in accordance with an embodiment of the present invention is described with reference to FIGS. 4 and 5.

Figure 4:
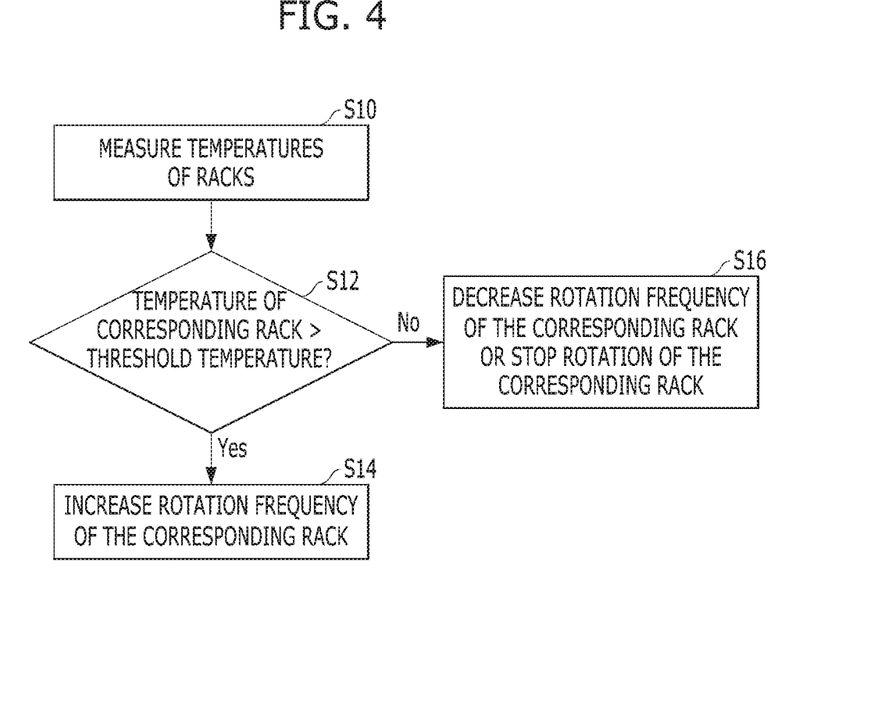
FIG. 4 is a flowchart of an operation method of a data center in accordance with an embodiment of the present invention.

FIG. 4 is a flowchart illustrating an operation of the data center based on the temperature information T1<1:6> to Tn<1:6>.

Referring to FIG. 4, the temperature sensing devices 400_1 to 400_n may measure the internal temperatures of the racks 200_1 to 200_n, respectively, and generate the temperature information T1<1:6> to Tn<1:6> corresponding to the internal temperatures recorded by the plurality of sensors S1 to S6 in each of the racks 200_1 to 200_n, in step S10.

The control device 700 may compare the internal temperatures of each of the racks 200_1 to 200_n with a threshold temperature based on the temperature information T1<1:6> to Tn<1:6> in step S12, and control the rotating devices 300_1 to 300_n to adjust their rotating speed based on the comparison result in steps S14 and S16. For example, the control device 700 may compare each of the internal temperatures T1<1:6> of the first rack 200_1 with the threshold temperature, and control the first rotating device 300_1 to rotate the first rack 200_1 at a first rotation speed, i.e., at a relatively higher speed, when the comparison result indicates that at least one of the internal temperatures T1<1:6> of the first rack 200_1 is higher than the threshold temperature. On the other hand, the control device 700 may compare each of the internal temperatures of the first rack 200_1 with the threshold temperature, and control the first rotating device 300_1 to rotate the first rack 200_1 at a second rotation speed which is slower than the first rotation speed, i.e., at a relatively lower speed or to stop the first rack 200_1, when the comparison result indicates that all of the internal temperatures of the first rack 200_1 are lower than the threshold temperature. The threshold temperature may be set in consideration of the pseudo cryogenic temperature, e.g., 77K. For example, the threshold temperature may be set to a higher temperature than the pseudo cryogenic temperature.

Figure 5:
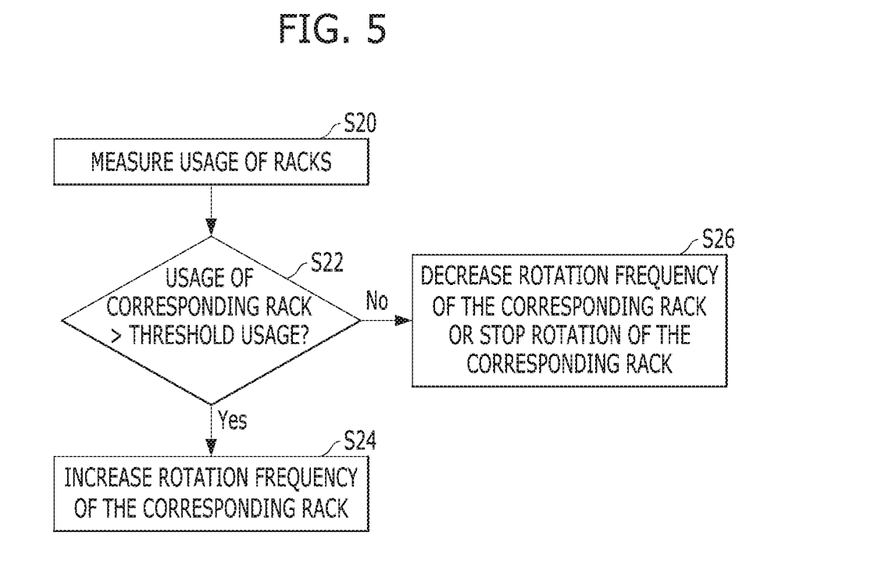
FIG. 5 is a flowchart of an operation method of a data center in accordance with an embodiment of the present invention.

FIG. 5 is a flowchart illustrating an operation of the data center based on the profile information RF.

Referring to FIG. 5, the host device 600 may measure the usages of the racks 200_1 to 200_n for each time slot, and generate the profile information RF corresponding to the usages of the racks 200_1 to 200_n for each time slot, in step S20. For example, the host device 600 may generate the first to $n^{th}$ profile information RF corresponding to the respective usages of the racks 200_1 to 200_n for each time slot. For example, first profile information for the usage of the first rack 200_1, second profile information for the second rack 200_2 and so on and so forth $n^{th}$ profile information for the usage of the $n^{th}$ rack 200_n. The host device 600 may generate $(n/m)^{th}$ pieces of group profile information, each piece of group profile information RF corresponding to the usage of a corresponding group of the racks 200_1 to 200_n at each time slot when the racks are categorized in n/m number of groups of a predetermined number 'm' of racks per group. In other words, the host device 600 may generate the first to $(n/m)^{th}$ pieces of profile information RF corresponding to the usages of the respective groups for each time slot. Or, the host device 600 may generate one profile information RF corresponding to the entire usage of all of the racks 200_1 to 200_n for each time slot. In an embodiment, the host device 600 may measure the usages of the racks 200_1 to 200_n for each time slot, and generate at least one of a) the profile information RF corresponding to the usages of the racks 200_1 to 200_n for each time slot, in step S20, b) $(n/m)^{th}$ pieces of group profile information, each piece of group profile information RF corresponding to the usage of a corresponding group of the racks 200_1 to 200_n at each time slot, and c) one profile information RF corresponding to the entire usage of all of the racks 200_1 to 200_n for each time slot.

The control device 700 may compare the usages of the racks 200_1 to 200_n for each time slot with a threshold usage based on the profile information RF in step S22, and control the rotating devices 300_1 to 300_n individually, collectively or by group based on the comparison result in step S24 and S26. For example, the control device 700 may compare the usage of the first rack 200_1 for each time slot with the threshold usage, and control the first rotating device 300_1 to rotate the first rack 200_1 at a first rotation speed, i.e., a relatively high speed, when the comparison result indicates that the usage of the first rack 200_1 for each time slot is larger than the threshold usage. On the other hand, the control device 700 may compare the usage of the first rack 200_1 for each time slot with the threshold usage, and control the first rotating device 300_1, a group to which the first rotating device 300_1 belongs or the entire rotating devices 300_1 to 300_n to rotate the first rack 200_1, a group to which the first rack 200_1 belongs or the entire racks 200_1 to 200_n at a second rotation speed slower than the first rotation speed, i.e., a relatively low speed, or to stop the first rack 200_1, the group to which the first rack 200_1 belongs or the entire racks 200_1 to 200_n, when the comparison result indicates that the usage of the first rack 200_1 for each time slot is smaller than the threshold usage.

As is apparent from the above descriptions, the data center in accordance with the present embodiment may use at least one piece of parameter information between temperature information and profile information. When the data center uses both of the temperature information and the profile information, the data center basically uses the temperature information while incidentally using the profile information. Alternatively, the data center may use only one of the temperature information and the profile information by giving priority to the corresponding information.

In accordance with the embodiment of the present invention, there is an advantage that the rack may uniformly receive the influence of the refrigerant induction pipe irrespective of the separation distance between the refrigerant induction pipe and the rack.

In accordance with the embodiment of the present invention, the pseudo cryogenic status of the rack may be maintained uniformly and evenly by minimizing the influence attributable to the structural constraints of the refrigerant induction pipe.

While the present invention has been illustrated and described with respect to specific embodiments, the disclosed embodiments are not intended to be restrictive. Further, it is noted that the present invention may be achieved in various ways through substitution, change, and modification, as those skilled in the art will recognize in light of the present disclosure, without departing from the spirit and/or scope of the present disclosure. The present invention is intended to embrace all such substitutions, changes and modifications that fall within the scope of the following claims.

What is claimed is:

1. A data center comprising:
a refrigerant induction pipe surrounding one or more regions of the data center;
a refrigerant supply device suitable for supplying a refrigerant to the refrigerant induction pipe, the refrigerant having a vaporization temperature corresponding to a pseudo cryogenic temperature;
a plurality of racks disposed in the one or more regions;
a plurality of rotating devices each suitable for rotating a corresponding one of the plurality of racks; and
a control device suitable for controlling each of the plurality of the rotating devices based on one or more pieces of parameter information,
wherein the parameter information includes one or more of plural pieces of temperature information corresponding to respective internal temperatures of the plurality of racks and one or more pieces of profile information corresponding to usages of the plurality of racks for each time slot.

2. The data center of claim 1, wherein the pseudo cryogenic temperature includes 77K±7K.

3. The data center of claim 1, wherein each of the rotating devices includes:
a supporting plate suitable for supporting a corresponding one of the plurality of racks; and
a motor suitable for rotating the supporting plate.

4. The data center of claim 1, wherein each of the racks has a cylindrical appearance.

5. The data center of claim 1, wherein the refrigerant includes liquid nitrogen.

6. A data center comprising:
a refrigerant induction pipe surrounding one or more regions of the data center;
a refrigerant supply device suitable for supplying a refrigerant to the refrigerant induction pipe, the refrigerant having a vaporization temperature corresponding to a pseudo cryogenic temperature;
a plurality of racks disposed in the one or more regions;
a plurality of rotating devices each suitable for rotating the plurality of racks, respectively;
a plurality of temperature sensing devices suitable for sensing respective internal temperatures of the plurality of racks; and
a control device suitable for controlling each of the plurality of the rotating devices based on plural pieces of temperature information generated from the temperature sensing devices,
wherein the control device controls a corresponding one of the rotating devices to rotate at a first rotation speed when a temperature of a corresponding one of the plurality of racks is higher than a threshold temperature, and controls the corresponding one of the rotating devices to rotate at a second rotation speed slower than the first rotation speed or to stop when the temperature of the corresponding one of the plurality of racks is lower than the threshold temperature.

7. The data center of claim 6, wherein the pseudo cryogenic temperature includes 77K±7K.

8. The data center of claim 6, wherein each of the temperature sensing devices includes two or more temperature sensors, and the two or more temperature sensors are disposed to face each other in pairs in each of the plurality of racks.

9. The data center of claim 6, wherein each of the rotating devices includes:
a supporting plate suitable for supporting a corresponding one of the plurality of racks; and
a motor suitable for rotating the supporting plate.

10. The data center of claim 6, wherein each of the plurality of racks has a cylindrical appearance.

11. The data center of claim 6, further comprising a host device suitable for generating one or more pieces of profile information corresponding to usages of the plurality of racks for each time slot,
wherein the control device controls the rotating devices individually, collectively or by group based on the profile information.

12. The data center of claim 11, wherein the control device controls the rotating devices to rotate at a first rotation speed in a first time slot in which the usages are higher than a threshold usage, and controls the rotating devices to rotate at a second rotation speed slower than the first rotation speed or to stop in a second time slot in which the usages are lower than the threshold usage.

13. The data center of claim 6, wherein the refrigerant includes liquid nitrogen.

14. A data center comprising:
a refrigerant induction pipe surrounding one or more regions of the data center;
a refrigerant supply device suitable for supplying a refrigerant to the refrigerant induction pipe, the refrigerant having a vaporization temperature corresponding to a pseudo cryogenic temperature;
a plurality of racks disposed in the one or more regions;
a plurality of rotating devices each suitable for rotating the plurality of racks, respectively; and
a control device suitable for controlling each of the plurality of the rotating devices individually, collectively or by group based on one or more pieces of profile information corresponding to usages of the plurality of racks for each time slot,
wherein the control device controls the rotating devices to rotate at a first rotation speed in a first time slot in which the usages are higher than a threshold usage, and controls the rotating devices to rotate at a second rotation speed slower than the first rotation speed or to stop in a second time slot in which the usages are lower than the threshold usage.

15. The data center of claim 14, wherein the pseudo cryogenic temperature includes 77K±7K.

16. The data center of claim 14,
wherein each of the rotating devices includes:
a supporting plate suitable for supporting a corresponding one of the plurality of racks;
a motor suitable for rotating the supporting plate.

17. The data center of claim 14, further comprising a host device suitable for generating the profile information,
wherein each of the plurality of racks has a cylindrical appearance, and wherein the refrigerant includes liquid nitrogen.

* * * * *